US012193292B2

(12) United States Patent
Wang et al.

(10) Patent No.: US 12,193,292 B2
(45) Date of Patent: Jan. 7, 2025

(54) DISPLAY SUBSTRATE AND DISPLAY APPARATUS

(71) Applicant: BOE TECHNOLOGY GROUP CO., LTD., Beijing (CN)

(72) Inventors: Bo Wang, Beijing (CN); Fuqiang Li, Beijing (CN); Yipeng Chen, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/924,137

(22) PCT Filed: Jan. 22, 2021

(86) PCT No.: PCT/CN2021/073363
§ 371 (c)(1),
(2) Date: Nov. 9, 2022

(87) PCT Pub. No.: WO2021/227553
PCT Pub. Date: Nov. 18, 2021

(65) Prior Publication Data
US 2023/0180552 A1    Jun. 8, 2023

(30) Foreign Application Priority Data
May 9, 2020    (CN) .......................... 202010387359.4

(51) Int. Cl.
*H10K 59/131*    (2023.01)
*G09G 3/3225*    (2016.01)
(Continued)

(52) U.S. Cl.
CPC ......... *H10K 59/131* (2023.02); *G09G 3/3225* (2013.01); *H10K 59/1213* (2023.02);
(Continued)

(58) Field of Classification Search
CPC ............. H10K 59/131; H10K 59/1213; H10K 59/1216
See application file for complete search history.

(56) References Cited

U.S. PATENT DOCUMENTS 9,711,585 B2 * 7/2017 Kim .................... H10K 50/813
9,853,096 B1   12/2017 Choi et al.
(Continued)

FOREIGN PATENT DOCUMENTS

CN    105243986 A    1/2016
CN    106097964 A    11/2016
(Continued)

OTHER PUBLICATIONS

USPTO, First Office Action, U.S. Appl. No. 17/762,975, issued May 5, 2023.
(Continued)

*Primary Examiner* — Sardis F Azongha
(74) *Attorney, Agent, or Firm* — HOUTTEMAN LAW LLC

(57) ABSTRACT

A base substrate of a display substrate includes a display region; a plurality of pixel units in the display region, each pixel unit includes a first pixel circuit and a second pixel circuit adjacent to each other in a first direction; an initialization signal line extending in the first direction and supplying an initialization signal to the first pixel circuit and the second pixel circuit; a first control signal line extending in the first direction and supplying a gate signal to the first pixel circuit and the second pixel circuit; and a light-emitting control signal line extending in the first direction and supplying a light-emitting control signal to the first pixel circuit and the second pixel circuit; the initialization signal line is on a side of the light-emitting control signal line away
(Continued)

from the first control signal line, extends along the first direction and includes segments arranged at intervals.

18 Claims, 11 Drawing Sheets

(51) Int. Cl.
*H10K 59/121* (2023.01)
*H10K 71/00* (2023.01)
*H10K 59/12* (2023.01)
*H10K 59/35* (2023.01)

(52) U.S. Cl.
CPC ......... *H10K 59/1216* (2023.02); *H10K 71/00* (2023.02); *G09G 2300/0426* (2013.01); *G09G 2300/0465* (2013.01); *G09G 2300/0842* (2013.01); *H10K 59/1201* (2023.02); *H10K 59/351* (2023.02)

(56) References Cited

U.S. PATENT DOCUMENTS

| | | | |
|---|---|---|---|
| 10,236,333 B2 | 3/2019 | Kim | |
| 10,304,920 B2 | 5/2019 | Choi et al. | |
| 10,516,015 B2 * | 12/2019 | Xin | H10K 59/131 |
| 10,854,684 B2 | 12/2020 | Huangfu et al. | |
| 11,257,897 B2 | 2/2022 | Cha et al. | |
| 11,348,992 B2 | 5/2022 | Oh et al. | |
| 11,355,059 B2 * | 6/2022 | Song | G09G 3/3233 |
| 11,600,688 B2 | 3/2023 | Park et al. | |
| 2009/0009070 A1 | 1/2009 | Chan et al. | |
| 2013/0057532 A1 | 3/2013 | Lee | |
| 2013/0241916 A1 | 9/2013 | Takasugi et al. | |
| 2017/0317158 A1 | 11/2017 | Choi et al. | |
| 2021/0083031 A1 | 3/2021 | Fang et al. | |
| 2021/0193775 A1 | 6/2021 | Kang et al. | |

FOREIGN PATENT DOCUMENTS

| | | | |
|---|---|---|---|
| CN | 106205470 A | 12/2016 | |
| CN | 106448555 A | 2/2017 | |
| CN | 206194348 U | 5/2017 | |
| CN | 108777260 A | 11/2018 | |
| CN | 109461407 A | 3/2019 | |
| CN | 109742131 A | 5/2019 | |
| CN | 110085651 A | 8/2019 | |
| CN | 110211992 A | 9/2019 | |
| CN | 110520923 A | 11/2019 | |
| CN | 110867525 A | 3/2020 | |
| CN | 210349260 U | 4/2020 | |
| CN | 111477669 A | 7/2020 | |
| CN | 111584610 A | 8/2020 | |
| CN | 109461407 B | 10/2020 | |
| EP | 2983205 A1 | 2/2016 | |
| IN | 108227263 A | 6/2018 | |
| JP | 2001142412 A | 5/2001 | |
| JP | 2009212219 A | 9/2009 | |
| JP | 2020052154 A | 4/2020 | |

OTHER PUBLICATIONS

PCT, international search report issued Apr. 26, 2021 for application No. PCT/CN2021/073363.
PCT, international search report issued Jul. 20, 2021 for application No. PCT/CN2021/087370.
European Patent Office, Extended European Search Report, issued Sep. 12, 2023 for application No. EP21804395.8.
Japan Patent Office, the first Office action of the JP application issued Oct. 28, 2024 for application No. JP2022-568469.

* cited by examiner

DISPLAY SUBSTRATE AND DISPLAY APPARATUS

TECHNICAL FIELD

The present disclosure relates to the field of display technology, and in particular to a display substrate and a display apparatus.

BACKGROUND

In the related art, users have higher and higher requirements on a mobile terminal device, and most of the users require a lighter and thinner device having more energy efficiency and capable of emitting light having a greater brightness. An organic light-emitting diode (OLED) display panel has characteristics of self-luminescence, implementing a display function without a backlight source, and becomes a preferred lighter and thinner display panel. In addition, requirements on the display panel in the market at present are no longer only a flat display panel, and the OLED display panel becomes the most widely applied display technology in the future due to the fact that an irregular display panel, a curved display panel, a transparent display panel and the like can be achieved by the OLED display panel. In particular, an active-matrix organic light-emitting diode (AMOLED) display panel requires a relatively complicated pixel compensation circuit to avoid non-uniform display due to different threshold voltages Vth of the driving transistors caused by a manufacturing process. How to realize an overall performance of the circuit in a limited space becomes a technical problem to be solved.

SUMMARY

Embodiments of the present disclosure provide a display substrate and a display apparatus.

The embodiment of the present disclosure provides a display substrate, which includes a base substrate including a display region; a plurality of pixel units in the display region, wherein each pixel unit includes at least one pixel circuit including a first pixel circuit and a second pixel circuit adjacent to each other in a first direction; an initialization signal line extending in the first direction and configured to supply an initialization signal to the first pixel circuit and the second pixel circuit; a first control signal line extending in the first direction and configured to supply a gate signal to the first pixel circuit and the second pixel circuit; and a light-emitting control signal line extending in the first direction and configured to supply a light-emitting control signal to the first pixel circuit and the second pixel circuit; wherein the initialization signal line is on a side of the light-emitting control signal line away from the first control signal line, extends along the first direction and comprises a plurality of segments arranged at intervals.

In some embodiments, the display substrate further includes an initialization bus on a side of the initialization signal line away from the base substrate, wherein the initialization bus is electrically connected to the initialization signal line.

In some embodiments, the initialization bus includes a plurality of main portions, a plurality of connection portions, and a plurality of branch portions; the plurality of main portions extend along the first direction and are arranged at intervals along a second direction, and are configured to provide the initialization signal to a corresponding plurality of initialization signal lines, each of which extends along the first direction and comprises a plurality of segments arranged at intervals; the plurality of connection portions extend along the second direction, so that two adjacent main portions are connected to each other through a corresponding connection portion; the plurality of branch portions each are connected to at least one of two adjacent main portions, the plurality of connection portions and the plurality of branch portions are alternately arranged at intervals along the first direction, and the plurality of branch portions are configured to respectively provide the initialization signal to a corresponding plurality of initialization signal lines, each of which is between the two adjacent main portions, extends along the first direction and includes a plurality of segments arranged at intervals.

In some embodiments, the display substrate further includes a second control signal line on a side of the initialization signal line away from the light-emitting control signal line, wherein the second control signal line extends in the first direction and is configured to supply a reset control signal to the first pixel circuit and the second pixel circuit.

In some embodiments, the display substrate further includes a plurality of first power lines extending along the second direction and arranged at intervals along the first direction, wherein the plurality of first power lines each are configured to provide a first power signal to a corresponding pixel circuit.

In some embodiments, the pixel circuit includes a light-emitting control transistor; a gate electrode of the light-emitting control transistor is connected to the light-emitting control signal line, the light-emitting control transistor includes a first electrode and a second electrode, and the second electrode and the first electrode of the light-emitting control transistor are on a first side and a second side of the light-emitting control signal line opposite to each other, respectively.

In some embodiments, the pixel circuit includes a driving transistor on the second side of the light-emitting control signal line; the driving transistor includes a first electrode and a second electrode, the first electrode of the driving transistor is connected to a corresponding first power line; and the second electrode of the driving transistor is connected to the first electrode of the light-emitting control transistor.

In some embodiments, the pixel circuit includes a first reset transistor between the second control signal line and the light-emitting control signal line; the second control signal line is connected to a gate electrode of the first reset transistor, the first reset transistor includes a first electrode and a second electrode, the first electrode of the first reset transistor is connected to the gate electrode of the driving transistor, and the second electrode of the first reset transistor is connected to a corresponding initialization signal line.

In some embodiments, the display substrate further includes a plurality of data lines extending along the second direction and spaced apart along the first direction, and configured to provide data signals to the pixel circuit.

In some embodiments, the pixel circuit includes a storage capacitor, a data writing transistor, and a first compensation transistor; the first control signal line is connected to a gate electrode of the data writing transistor and a gate electrode of the first compensation transistor; the data writing transistor includes a first electrode and a second electrode, the first electrode of the data writing transistor is connected to a corresponding data line; the storage capacitor includes a first plate and a second plate, the first plate of the storage capacitor is connected to a second electrode of the data writing transistor, the second plate of the storage capacitor is connected to the gate electrode of the driving transistor; the first compensation transistor includes a first electrode and a second electrode, the first electrode of the first compensation transistor is connected to the gate electrode of the driving transistor, and the second electrode of the first compensation transistor is connected to the second electrode of the driving transistor.

In some embodiments, the initialization signal line and the first electrode of the storage capacitor are in a same layer and spaced apart from each other.

In some embodiments, the data writing transistor and the first compensation transistor are on a side of the first control signal line close to the light-emitting control signal line.

In some embodiments, the pixel circuit includes a second compensation transistor, the light-emitting control signal line is connected to a gate electrode of the second compensation transistor, the second compensation transistor includes a first electrode on the first side of the light-emitting control signal line, and the first electrode of the second compensation transistor is connected to the first electrode of the first reset transistor.

In some embodiments, the display substrate further includes a first connection electrode extending along the second direction, wherein the first connection electrode is connected to the gate electrode of the driving transistor, the first electrode of the first compensation transistor, and the first electrode of the second compensation transistor.

In some embodiments, the pixel circuit includes a second reset transistor and a third reset transistor between the second control signal line and the light-emitting control signal line; the second control signal line is connected to a gate electrode of the second reset transistor, the light-emitting control signal line is connected to a gate electrode of the third reset transistor; the second reset transistor includes a first electrode and a second electrode, the first electrode of the second reset transistor is connected to the second electrode of the data writing transistor, the second electrode of the second reset transistor is connected to a corresponding initialization signal line; the third reset transistor includes a first electrode and a second electrode, the first electrode of the third reset transistor is connected to the second electrode of the data writing transistor, and the second electrode of the third reset transistor is connected to a corresponding initialization signal line.

In some embodiments, the display substrate further includes a second connection electrode extending in the second direction, wherein the second connection electrode is connected to the first electrode of the third reset transistor and the second electrode of the data writing transistor.

In some embodiments, the first connection electrode, the second connection electrode, the plurality of data lines, and the plurality of first power lines are in a same layer.

In some embodiments, the display substrate further includes a light-emitting element, wherein the second electrode of the light-emitting control transistor is connected to a first electrode of the light-emitting element, and the initialization bus and the first electrode of the light-emitting element are in a same layer and spaced apart from each other.

In some embodiments, the pixel circuit includes a fourth reset transistor between the second control signal line and the light-emitting control signal line; the second control line signal line is connected to a gate electrode of the fourth reset transistor, the fourth reset transistor includes a first electrode and a second electrode, the first electrode of the fourth reset transistor is connected to the first electrode of the light-emitting element, and the second electrode of the fourth reset transistor is connected to a corresponding initialization signal line.

Embodiments of the present disclosure further provide a display apparatus including the display substrate according to any one of the above embodiments.

Additional aspects and advantages of the present disclosure will be set forth in part in the following description, will become apparent in part from the following description, or may be learned by practice of the present disclosure.

BRIEF DESCRIPTION OF DRAWINGS

The above and/or additional aspects and advantages of the present disclosure will become apparent and readily appreciated from the following description of the embodiments, taken in conjunction with the accompanying drawings, in which.

DETAIL DESCRIPTION OF EMBODIMENTS

Figure 1:
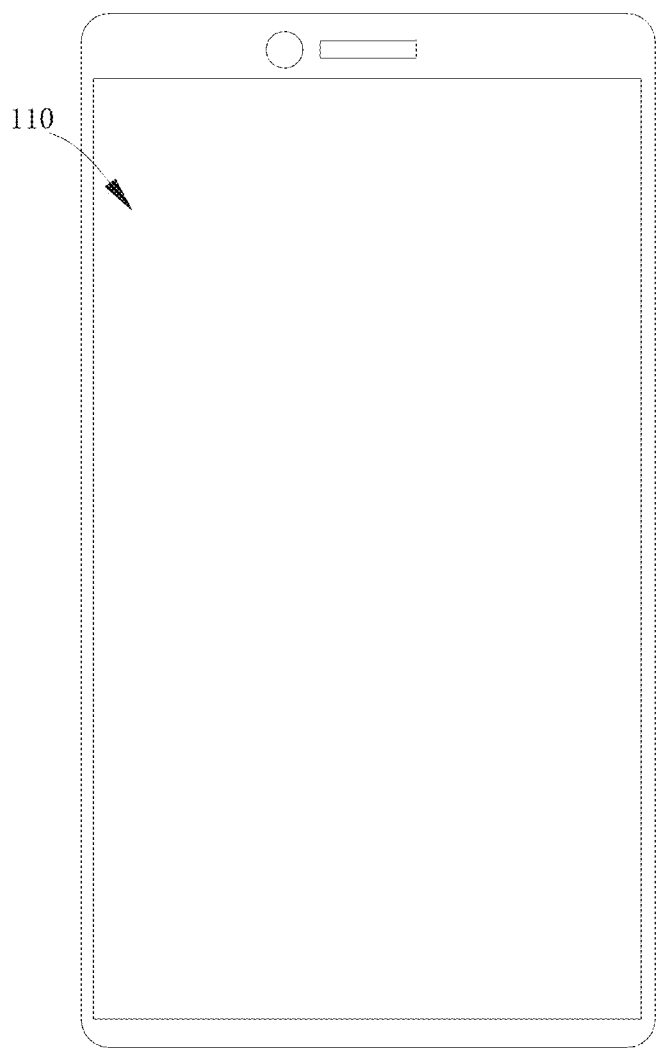
FIG. 1 is a schematic diagram of a structure of an electronic apparatus according to an embodiment of the present disclosure.

Embodiments of the present disclosure will be described in detail below, and examples of the embodiments are illustrated in the accompanying drawings, where same or similar reference numbers refer to the same or similar elements or elements having the same or similar functions throughout the description. The embodiments described below with reference to the accompanying drawings are exemplary only for explaining the present disclosure and are not to be construed as limiting the present disclosure.

In the description of the present disclosure, it should be understood that the terms "up", "down", "left", "right", "top", "bottom", "inner", "outer", and the like indicate the orientations and positional relationships in the drawings for convenience in describing the present disclosure and simplifying the description only, but are not intended to indicate or imply that the device or element so referred to must have a particular orientation, be constructed and operated in a particular orientation, and are not to be construed as limiting the present disclosure. Furthermore, the terms "first" and "second" are used for descriptive purposes only and should not to be construed as indicating or implying relative importance or implicitly indicating the number of technical features indicated. Thus, a feature defined by the term "first" or "second" may explicitly or implicitly include one or more features. In the description of the present disclosure, the term "a plurality of" means two or more unless specifically limited otherwise.

The following disclosure provides many different embodiments or examples for implementing different structures of the present disclosure. To simplify the present disclosure, components and arrangements in specific examples are described below. Alternatively, they are merely examples and are not intended to limit the present disclosure. Further, reference numerals and/or reference letters may be repeated in the various examples in the present disclosure for simplicity and clarity, and do not indicate a relationship between the various examples and/or arrangements discussed. In addition, the present disclosure provides examples of various specific processes and materials, but one of ordinary skill in the art may readily know use of other processes and/or other materials.

With the increased Pixels Per Inch (PPI), a resolution of an organic light-emitting diode (OLED) display apparatus becomes higher and higher, so that a pixel size of a backplane circuit of the display apparatus is gradually reduced. A design space for a single pixel unit is getting smaller. For example, in the organic light-emitting diode display panel, a structure of a pixel circuit of the single pixel unit may include a plurality of transistors (for example, seven or more transistors). For example, the structure of the pixel circuit includes a structure of 9T1C, but is not limited thereto. Because a width of each circuit wire in the circuit on a substrate and a distance between the circuit wires are reduced, a difficulty in layout of the circuit wires is correspondingly increased. The embodiment of the present disclosure will be described by taking the structure of the pixel circuit of the 9T1C as an example.

Referring to FIGS. 1 to 5, a display substrate 110 according to an embodiment of the present disclosure includes a base substrate 111, a plurality of pixel units 112, an initialization signal line 113, a first control signal line 114A, and a light-emitting control signal line 115. The base substrate 111 includes a display region 1111, the plurality of pixel units 112 are disposed in the display region 1111 and arranged in a matrix, each pixel unit 112 includes a pixel circuit 1121, which includes a first pixel circuit 1121a and a second pixel circuit 1121b adjacent to each other in a first direction. The initialization signal line 113 extends in the first direction, and is configured to supply an initialization signal Vinit to the first pixel circuit 1121a and the second pixel circuit 1121b. The first control signal line 114A extends in the first direction and is configured to a supply gate signal Sn to the first pixel circuit 1121a and the second pixel circuit 1121b. The light-emitting control signal line 115 extends in the first direction, and is configured to supply a light-emitting control signal EM to the first pixel circuit 1121a and the second pixel circuit 1121b. The initialization signal line 113 is located on a side of the light-emitting control signal line 115 away from the first control signal line 114A, and extends along the first direction and includes a plurality of segments arranged at intervals.

The display substrate 110 provided in the embodiment of the present disclosure may be applied to the display apparatus 100 according to the embodiment of the present disclosure. That is, the display apparatus 100 according to the embodiment of the present disclosure may display an image by using the display substrate 110 according to the embodiment of the present disclosure.

In the display substrate 110 and the display apparatus 100 of the present disclosure, the initialization signal line 113 is designed to be arranged along the first direction to include the plurality of segments (portions) arranged at intervals, so that a space occupied by the initialization signal line 113 in the substrate is reduced, the layout for the wires of the display substrate 110 is optimized in a limited space, and more performance requirements are met.

In some embodiments, the display apparatus 100 may be the display apparatus 100 which can display an image, such as a smart phone, a tablet computer, a smart band, a virtual reality device, a personal data terminal, a notebook computer, or the like, but is not limited thereto. In the embodiment shown in FIG. 1, the display apparatus 100 is a smart phone.

In some embodiments, the display substrate 110 includes a plurality of first power lines 116A extending along the second direction and spaced apart from each other along the first direction, and configured to provide first power signals ELVDD to the pixel circuits 1121, respectively. Specifically, the first power signal ELVDD is a constant high level voltage signal.

In some embodiments, the display substrate 110 includes a plurality of data lines 117 extending along the second direction and spaced apart from each other along the first direction, and configured to provide data signals to the pixel circuits 1121, respectively.

When the display substrate 110 is used to display, one pixel may include a plurality of pixel units 112. Further, one pixel may include a plurality of pixel units 112 emitting light of different colors. For example, one pixel includes a pixel unit 112 emitting red light, a pixel unit 112 emitting green light, and a pixel unit 112 emitting blue light, but is not limited thereto. The number of the pixel units 112 included in one pixel and the light-emitting condition of each pixel unit 112 may be determined as needed. The display apparatus 100 may generate a corresponding data signal from each pixel value in an image and supply the data signal to a corresponding pixel circuit 1121 through a corresponding data line 117.

In some embodiments, the display substrate 110 further includes a second control signal line 114B on a side of the initialization signal line 113 away from the light-emitting control signal line 115, extending in the first direction and configured to provide a reset control signal RESET to the first pixel circuit 1121a and the second pixel circuit 1121b.

Further, each pixel circuit 1121 includes a third pixel circuit 1121c and a fourth pixel circuit 1121d adjacent to each other along the first direction; the first pixel circuit 1121a is adjacent to the third pixel circuit 1121c along the second direction, and the second pixel circuit 1121b is adjacent to the fourth pixel circuit 1121d along the second direction. The second control signal line 114B may further be configured to supply the gate signals Sn to the third pixel circuits 1121c and the fourth pixel circuits 1121d. Specifically, the second control signal line 114B may supply the gate signals Sn to the third pixel circuits 1121c and the fourth pixel circuits 1121d while supplying the reset control signals RESET to the first pixel circuits 1121a and the second pixel circuits 1121b.

In some embodiments, the display substrate 110 includes a plurality of light-emitting elements 118, and each pixel circuit 1121 is connected to a corresponding light-emitting element 118 to drive the light-emitting element 118 to emit light. The display substrate 110 may include a second power line 119 configured to supply second power signals ELVSS to the light-emitting elements 118.

In particular, the second power signal ELVSS is a constant low level voltage signal. The magnitude of the first power signal ELVDD is greater than that of the second power signal ELVSS. It should be noted that the initialization signal Vinit is a constant voltage signal having a magnitude, for example, between the magnitudes of the first power signal ELVDD and the second power signal ELVSS, but is not limited thereto. For example, the magnitude of the initialization signal Vinit may be less than or equal to the magnitude of the second power signal ELVSS.

In some embodiments, the display substrate 110 may include a plurality of third power lines 116B extending along the first direction, and disposed at intervals along the second direction. The third power lines 116B may be connected to the first power lines 116A and configured to supply the first power signal ELVDD to the pixel circuits 1121, respectively.

In this way, the first power lines 116A and the third power lines 116B, extending in different directions, cross each other, which is beneficial to maintaining the stability of the first power signal ELVDD provided to the pixel circuits 1121 of the entire display substrate 110.

In some embodiments, each pixel circuit 1121 includes a data writing transistor T1, a first compensation transistor T2, a driving transistor T3, a first reset transistor T4, a second reset transistor T5, a third reset transistor T6, a light-emitting control transistor T7, a fourth reset transistor T8, a second compensation transistor T9, and a storage capacitor C1.

It can be understood that the driving transistor T3, the storage capacitor C1 and the light-emitting element 118 in each pixel circuit 1121 may be initialized to through the initialization signals Vinit under the action of the reset control signals RESET in a reset stage, so as to ensure that the state of the pixel circuit 1121 is kept consistent when each displayed frame of image is refreshed, and ensure that the display apparatus 100 can display normally. In a data writing stage, in each pixel circuit 1121, a data signal provided by a data signal line may be written into the storage capacitor C1 for storage under the action of the gate signals Sn, and a compensation for a threshold voltage of the third transistor T3 may be realized. In a light-emitting control stage, in each pixel circuit 1121, the data signal may be converted into a current signal under the action of the light-emitting control signals EM to drive the light-emitting element 118 to emit light, thereby displaying an image.

The display apparatus 100 according to the embodiment of the present disclosure further includes: a data driving circuit 120 and a scan driving circuit 130. The data driving circuit 120 is configured to supply data signals to the pixel units 112 according to an instruction of a control circuit; the scan driving circuit 130 is configured to supply signals such as light-emitting control signals EM, gate signals Sn, reset control signals RESET, and initialization signals Vinit to the pixel units 112 according to an instruction of the control circuit.

Figure 2:
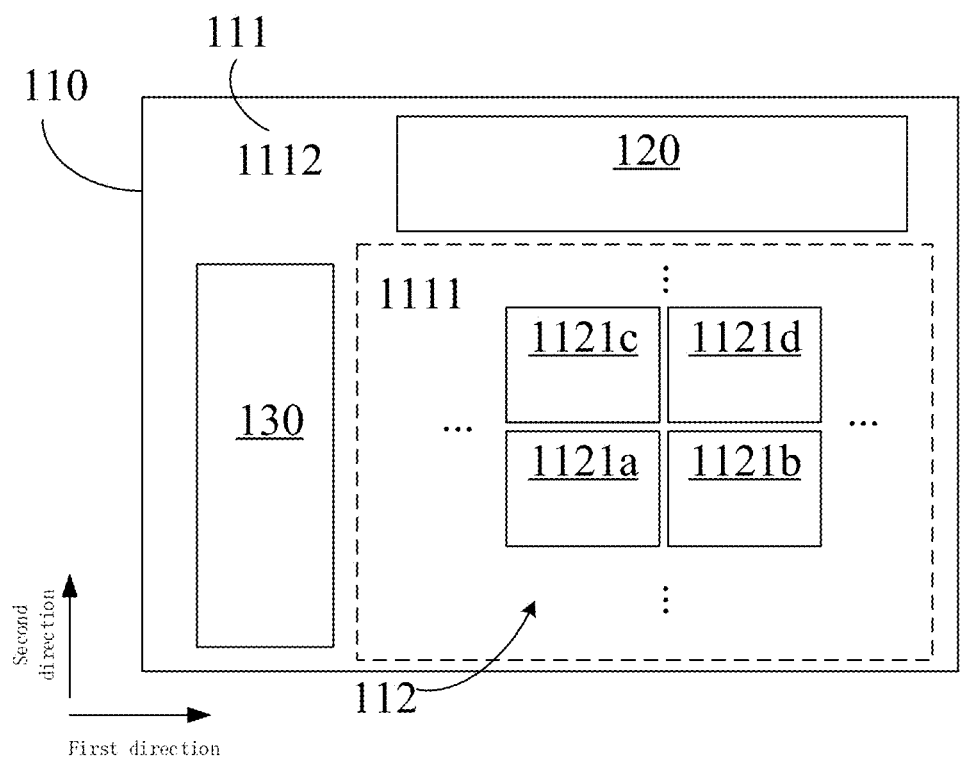
FIG. 2 is a schematic plan view of a structure of a display substrate according to an embodiment of the present disclosure.
Figure 3:
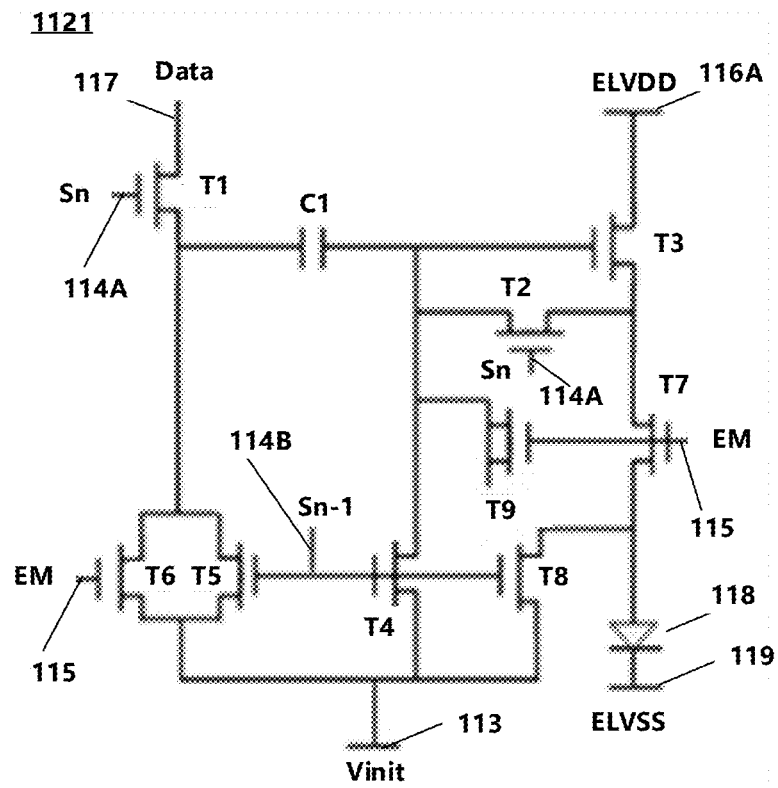
FIG. 3 is a schematic circuit diagram of a pixel circuit according to an embodiment of the present disclosure.

In the embodiment shown in FIG. 2, the display substrate 110 includes a non-display region 1112 in which the data driving circuit 120 and the scan driving circuit 130 may be disposed, which is not limited thereto. For example, the data driving circuit 120 and the scan driving circuit 130 may be disposed in a circuit board, such as a printed circuit board and/or a flexible circuit board, etc., where an electronic device is connected to the display substrate 110.

In some embodiments, the control circuit of the display substrate 110 includes an external integrated circuit (IC), but is not limited thereto. In some embodiments, the scan driving circuit 130 has a Gate On Array (GOA) structure mounted on the display panel, or a driving chip (IC) structure bonded to the display panel. For example, different driving circuits may be used to provide the light-emitting control signal EM and the gate signal Sn, respectively. In some embodiments, the display apparatus 100 further includes a power supply (not shown) to provide the above power signals. The power supply may be a voltage source or a current source as needed, and be configured to provide the first power signal ELVDD, the second power signal ELVSS, the initialization signal Vinit, or the like to the pixel unit 112 through the first power line 116A, the second power line 119, and the initialization signal line 113, respectively.

In some embodiments, the light-emitting control signal line 115 is connected to a gate electrode T70 of the light-emitting control transistor T7. A portion of the light-emitting control signal line 115 serves as the gate electrode T70 of the light-emitting control transistor T7.

Further, the light-emitting control transistor T7 includes a first electrode T71 and a second electrode T72; and the second electrode T72 and the first electrode T71 of the light-emitting control transistor T7 are respectively located on a first side and a second side opposite to each other of the light-emitting control signal line 115.

In some embodiments, the driving transistor T3 is located on a second side of the light-emitting control signal line 115, and includes a first electrode T31 connected to the first power line 116A and a second electrode T32 connected to the first electrode T71 of the light-emitting control transistor T7.

In some embodiments, the first reset transistor T4 is located between the second control signal line 114B and the light-emitting control signal line 115, and the second control signal line 114B is connected to a gate electrode T40 of the first reset transistor T4. The first reset transistor T4 includes a first electrode T41 connected to a gate electrode T30 of the driving transistor T3 and a second electrode T42 connected to the initialization signal line 113.

In particular, a portion of the second control signal line 114B serves as the gate electrode T40 of the first reset transistor T4. The first control signal line 114A may supply a reset control signal RESET to the first reset transistor T4, and the first reset transistor T4 supplies an initialization signal Vinit to the gate electrode T30 of the driving transistor T3 for initialization under the action of the reset control signal RESET.

In some embodiments, the first control signal line 114A is connected to a gate electrode T10 of the data writing transistor T1 and a gate electrode T20 of the first compensation transistor T2, respectively.

Specifically, a portion of the first control signal line 114A may serve as the gate electrode T10 of the data writing transistor T1; another portion of the first control signal line 114A may serve as the gate electrode T20 of the first compensation transistor T2.

Further, in some examples, the data writing transistor T1 includes a first electrode T11 connected to the data line 117 and a second electrode T12; the storage capacitor C1 includes a first plate C11 connected to the second electrode T12 of the data writing transistor T1 and a second plate C12 connected to the gate electrode T30 of the driving transistor T3.

In particular, the second plate C12 of the storage capacitor C1 may serve as the gate electrode T30 of the driving transistor T3. The first control signal line 114A may supply a gate signal Sn to the data writing transistor T1, and the data writing transistor T1 may write the data signal supplied from the data line 117 into the storage capacitor C1 under the action of the gate signal Sn.

In one example, the storage capacitor C1 is located between the first control signal line 114A and the light-emitting control signal line 115.

Further, the first compensation transistor T2 includes a first electrode T21 connected to the gate electrode T30 of the driving transistor T3 and a second electrode T22 connected to the second electrode T32 of the driving transistor T3.

In this way, the first control signal line 114A provides the gate signal Sn to the first compensation transistor T2, and the first compensation transistor T2 may electrically connect the gate electrode T30 and the second electrode T32 of the driving transistor T3 under the action of the gate signal Sn, so as to compensate the threshold voltage of the driving transistor T3 when the data signal is written.

In some embodiments, the data writing transistor T1 and the first compensation transistor T2 are located on a side of the first control signal line 114A close to the light-emitting control signal line 115.

That is, the first control signal line 114A is configured to supply a gate signal Sn to the first pixel circuit 1121$a$ and the second pixel circuit 1121$b$ on a side where the first control signal line 114A is located. It should be noted that the first control signal line 114A may also be configured to provide reset control signals RESET to other pixel circuits 1121 on the other side of the first control signal line 114A opposite to the side of the first control signal line 114A where the first pixel circuits 1121$a$ and the second pixel circuits 1121$b$, which is not limited thereto.

In some embodiments, the light-emitting control signal line 115 is connected to a gate electrode T90 of the second compensation transistor T9; the second compensation transistor T9 includes a first electrode T91 on the first side of the light-emitting control signal line 115, and connected to the first electrode T41 of the first reset transistor T4.

In particular, a portion of the light-emitting control signal line 115 may serve as the gate electrode T90 of the second compensation transistor T9. The first electrode T91 of the second compensation transistor T9 on the first side of the light-emitting control signal line 115 is connected to the first electrode T41 of the first reset transistor T4 on the first side of the light-emitting control signal line 115.

During the data writing stage, in each pixel circuit 1121, the first compensation transistor T2 is short connected as a diode, to realize the compensation for the threshold voltage of the driving transistor T3, while an equivalent capacitor exists between the gate electrode and the drain electrode of the short connected first compensation transistor T2; when the charging of the storage capacitor C1 is completed, a potential at a terminal connected to the gate electrode of the driving transistor T3 is a threshold voltage of the driving transistor T1. During the short connected first compensation transistor T2 is turned off, the charges stored in the equivalent capacitor of the first compensation transistor T2 are injected into the storage capacitor C1 due to changes of a bias voltage and a capacity, which easily causes an error in a threshold voltage signal held on the storage capacitor C1. Thus, by providing the second compensation transistor T9, after the data writing stage is completed, since the second compensation transistor T9 has an equivalent capacitor, when the first compensation transistor T2 is turned off, the charges released by the equivalent capacitor between the gate electrode and the drain electrode of the first compensation transistor T2 can be fully or partially absorbed by the equivalent capacitor of the second compensation transistor T9, thereby maintaining the threshold voltage to be accurate and stable.

It should be noted that a second electrode (not shown) of the second compensation transistor T9 on a second side of the light-emitting control signal line 115 may be floating.

In some embodiments, the display substrate 110 includes a first connection electrode 11211 extending in the second direction, and connected to the gate electrode T30 of the driving transistor T3 (the second plate C12 of the storage capacitor C1), the first electrode T21 of the first compensation transistor T2, and the first electrode T91 of the second compensation transistor T9.

Specifically, the display substrate 110 includes a multi-layer structure, wires in the pixel circuits 1121 may be disposed in different layers, and electrodes of different elements may also be disposed at different positions in a same layer or different layers, and thus, the first connection electrode 11211 may be disposed in a layer of the substrate to electrically connect the gate electrode T30 of the driving transistor T3, the first electrode T21 of the first compensation transistor T2, and the first electrode T91 of the second compensation transistor T9 together, which are disposed in different layers or at different positions. The first connection electrode 11211 may be connected to corresponding elements through vias formed in the layers of the substrate.

In one example, the first plate C11 of the storage capacitor C1 is formed with a plate via therein, through which the first connection electrode 11211 may be connected to the second plate C12 of the storage capacitor C1, i.e., the gate electrode T30 of the driving transistor T3.

In some embodiments, the second reset transistor T5 and the third reset transistor T6 are located between the second control signal line 114B and the light-emitting control signal line 115; the second control signal line 114B is connected to a gate electrode T50 of the second reset transistor T5, and the light-emitting control signal line 115 is connected to a gate electrode T60 of the third reset transistor T6.

Specifically, a portion of the second control signal line 114B may serve as the gate electrode T50 of the second reset transistor T5, and a portion of the light-emitting control signal line 115 may serve as the gate electrode T60 of the third reset transistor T6.

Further, in some embodiments, the second reset transistor T5 includes a first electrode T51 connected to the second electrode T12 of the data writing transistor T1 and a second electrode T52 connected to the initialization signal line 113.

In this way, the second control signal line 114B may provide the reset control signal RESET to the second reset transistor T5, and the second reset transistor T5 may provide the initialization signal Vinit to the second electrode T12 of the data writing transistor T1 and the first plate C11 of the storage capacitor C1 for initialization by the reset control signal RESET.

In some embodiments, the third reset transistor T6 includes a first electrode T61 connected to the second electrode T12 of the data writing transistor T1 and a second electrode T62 connected to the initialization signal line 113.

In this way, the light-emitting control signal EM supplies the light-emitting control signal EM to the third reset transistor T6, and the third reset transistor T6 may supply the initialization signal Vinit to the second electrode T12 of the data writing transistor T1 and the first plate C11 of the storage capacitor C1 for initialization by the light-emitting control signal EM.

In some embodiments, the display substrate 110 includes a second connection electrode 11212 extending in the second direction, and connected to the first electrode T51 of the second reset transistor T5, the first electrode T61 of the third reset transistor T6, the first plate C11 of the storage capacitor C1, and the second electrode T12 of the data writing transistor T1.

Likewise, the second connection electrode 11212 is provided to electrically connect the first electrode T51 of the second reset transistor T5, the first electrode T61 of the third reset transistor T6, the first plate C11 of the storage capacitor C1, and the second electrode T12 of the data writing transistor T1 together, which are disposed in different layers or at different positions. The second connection electrode 11212 may be connected to corresponding elements through vias formed in the layers of the substrate.

In some embodiments, the first connection electrode 11211, the second connection electrode 11212, the data lines 117, and the first power lines 116A are disposed in the same layer.

In some embodiments, the second electrode T72 of the light-emitting control transistor T7 is connected to a first electrode 1181 of the light-emitting element 118.

Specifically, the light-emitting control transistor T7 may be turned on by the light-emitting control signal EM, the driving transistor T3 generates a driving current by the first power signal ELVDD, and the light-emitting control transistor T7 transmits the driving current to the first electrode 1181 of the light-emitting element 118 to drive the light-emitting element 118 to emit light.

In some embodiments, the fourth reset transistor T8 is located between the second control signal line 114B and the light-emitting control signal line 115; the second control signal line 114B is connected to a gate electrode T80 of the fourth reset transistor T8.

In particular, a portion of the second control signal line 114B may serve as the gate electrode T80 of the fourth reset transistor T8.

Further, in some embodiments, the fourth reset transistor T8 includes a first electrode T81 connected to the first electrode 1181 of the light-emitting element 118 and a second electrode T82 connected to the initialization signal line 113.

In this way, the second control signal line 114B may provide the reset control signal RESET to the fourth reset transistor T8, and the fourth reset transistor T8 may provide the initialization signal Vinit to the first electrode 1181 of the light-emitting element 118 for initialization under the action of the reset control signal RESET.

In some embodiments, the display substrate 110 includes a buffer layer 120 on the base substrate 111, and the pixel circuit 1121 includes an active layer 121 on the buffer layer 120, a first insulating layer 122 on a side of the active layer 121 away from the base substrate 111, a gate layer 123 on the first insulating layer 122, a second insulating layer 124 on a side of the gate layer 123 away from the base substrate 111, a third insulating layer 125 on the second insulating layer 124, and a source-drain layer 126 on the third insulating layer 125.

In some embodiments, a material of the buffer layer 120 may include an insulating material such as silicon oxide, silicon nitride, and silicon oxynitride. A material of one or more of the third insulating layer 125, the second insulating layer 124, and the first insulating layer 122 may include an insulating material such as silicon oxide, silicon nitride, and silicon oxynitride. The materials of the third insulating layer 125, the second insulating layer 124 and the first insulating layer 122 may be the same or different.

Figure 4:
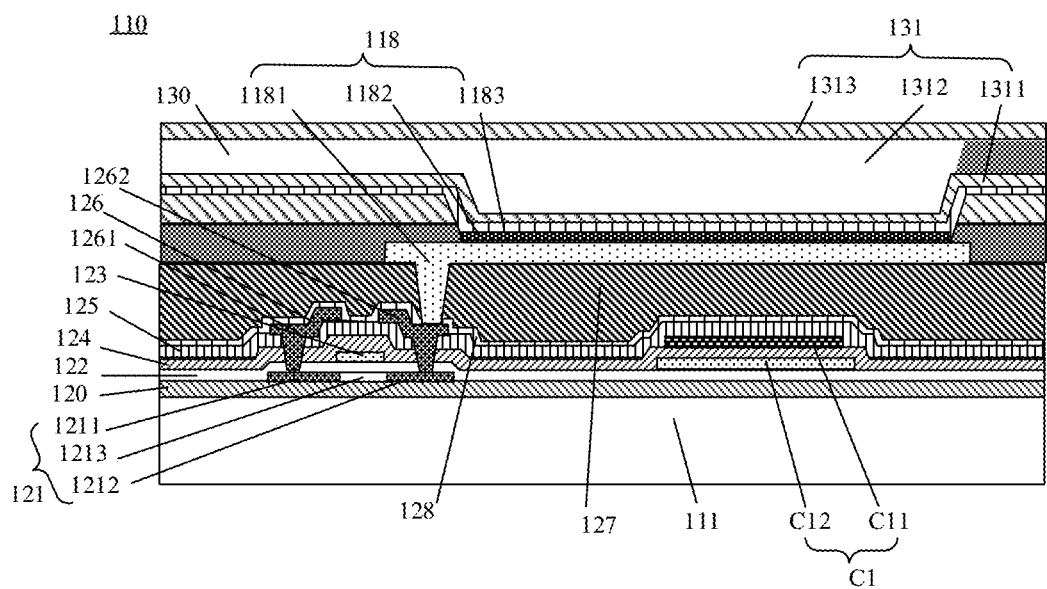
FIG. 4 is a schematic cross-sectional view of a display substrate according to an embodiment of the present disclosure.
Figure 5:
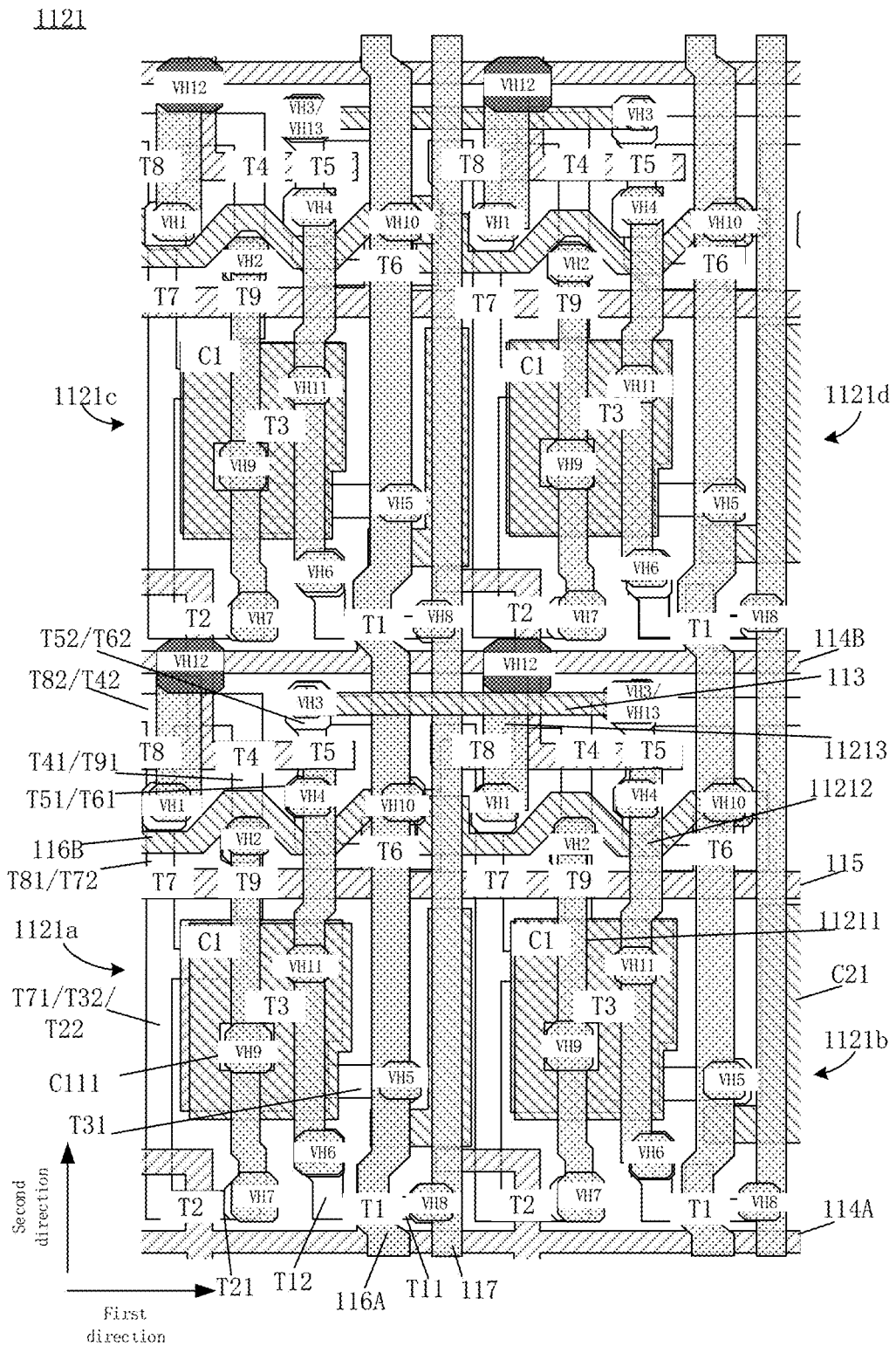
FIG. 5 is a schematic top view of a part of a display substrate according to an embodiment of the present disclosure.

In some embodiments, in some examples of the above embodiments of the present disclosure, as shown in FIG. 4, the active layer 121 may include a source region 1211 and a drain region 1212, and a channel region 1213 between the source region 1211 and the drain region 1212. The third insulating layer 125, the second insulating layer 124, and the first insulating layer 122 are provided with vias therein to expose the source region 1211 and the drain region 1212. A first electrode 1261 and a second electrode 1262 of the transistor are electrically connected to the source region 1211 and the drain region 1212 through vias, respectively. The gate layer 123 overlaps the channel region 1213 between the source region 1211 and the drain region 1212 in the active layer 121 in a direction perpendicular to the base substrate 111.

In some embodiments, the display substrate 110 further includes a planarization layer 127 on a side of the source-drain layer 126 away from the base substrate 111. The planarization layer 127 is located above the first electrode 1261 and the second electrode 1262 of the transistor and is used for flattening a surface of each pixel circuit 1121 away from the base substrate 111. Vias are formed in the planarization layer 127 to expose first and second electrodes 1261, 1262 of the transistor (as shown). A passivation layer 128 may also be formed between the pixel circuits 1121 and the planarization layer 127 and includes passivation layer vias. The passivation layer 128 can prevent the first and second electrodes 1261 and 1262 of the transistor of the pixel circuit 1121 from being corroded by moisture.

The transistor shown in FIG. 4 may be the fourth reset transistor T8 or the light-emitting control transistor T7. It is understood that the other transistors of the pixel circuit may be formed at other positions on the substrate. Accordingly, the other transistors may also be connected as required, and are not limited herein.

For example, a material of the active layer 121 may include poly-silicon or an oxide semiconductor (e.g., indium gallium zinc oxide). A material of the gate electrode may include a metal material or an alloy material, such as a metal single layer or a multi-layer structure formed by Mo, Al, Ti, etc., for example, the multi-layer structure is a stacked plurality of metal layers (e.g., stacked Ti, Al, and Ti layers (Ti/Al/Ti)); materials of the source electrode and the drain electrode may include a metal material or an alloy material, such as a metal single layer or a multi-layer structure formed by Mo, Al, Ti, etc., for example, the multi-layer structure is a stacked plurality of metal layers (e.g., stacked Ti, Al, and Ti layers (Ti/Al/Ti)). The material of each functional layer is not particularly limited by the embodiments of the present disclosure.

In some embodiments, a material of the passivation layer 128 may include an organic insulating material or an inorganic insulating material, for example, a silicon nitride material. The passivation layer 128 can prevent the pixel driving circuits from being corroded by moisture due to its high dielectric constant and hydrophobic property.

In some embodiments, the light-emitting element 118 may be formed on the planarization layer 127, i.e., the light-emitting element 118 is disposed on a side of the planarization layer 127 away from the base substrate 111. The light-emitting element 118 includes a first electrode 1181, a light-emitting layer 1182, and a second electrode 1183. The first electrode 1181 of the light-emitting element 118 is electrically connected to the first electrode 1261 and/or the second electrode 1262 of the corresponding transistor through a via in the planarization layer 127. A pixel defining layer 130 is formed on the first electrode 1181 of the light-emitting element 118, and includes a plurality of openings to define the plurality of pixel units 112. Each of the plurality of openings exposes the first electrode 1181 of the corresponding light-emitting element 118; then, the light-emitting layer 1182 is disposed in the plurality of openings of the pixel defining layer 130, and the second electrode 1183 of the light-emitting element 118 is disposed on the pixel defining layer 130 and the light-emitting layer 1182. For example, the second electrode 1183 may be disposed in a part or the whole of the display region 1111, so that the second electrode 1183 may be formed in the entire surface in the manufacturing process.

In some embodiments, the pixel circuit 1121 may include an adapter electrode 11213 through which the first electrode 1181 of the light-emitting element 118 is connected to the first electrode 1261 and/or the second electrode 1262 of the corresponding transistor in the display substrate 110. In this way, by providing the adapter electrodes 11213, a relative position between the pixel circuit 1121 and the corresponding light-emitting element 118 on the display panel 110 can be made more flexible.

For example, the first electrode 1181 of the light-emitting element 118 may include a reflective layer (not shown), and the second electrode 1182 of the light-emitting element 118 may include a transparent layer or a semi-transparent layer. Thus, the first electrode 1181 of the light-emitting element 118 may reflect light emitted from the light-emitting layer 1182, and a portion of the light is emitted to the external environment through the second electrode 1183 of the light-emitting element 118, so that a light outgoing efficiency may be improved. When the second electrode 1183 of the light-emitting element 118 includes the semi-transparent layer, some of the light reflected by the first electrode 1181 of the light-emitting element 118 is reflected again by the second electrode 1183 of the light-emitting element 118, and thus the first electrode 1181 of the light-emitting element 118 and the second electrode 1183 of the light-emitting element 118 form a resonant structure, so that the light outgoing efficiency may be improved.

For example, a material of the first electrode 1181 of the light-emitting device 118 may include at least one transparent conductive oxide material, including Indium Tin Oxide (ITO), Indium Zinc Oxide (IZO), zinc oxide (ZnO), or the like. In addition, the first electrode 1181 of the light-emitting element 118 may include a metal (such as silver (Ag)) having a high reflectivity as a reflective layer.

For example, for the OLED, the light-emitting layer 1182 may include a small molecule organic material or a polymer molecule organic material. Alternatively, the light-emitting layer 1182 may be a fluorescent light-emitting material or a phosphorescent light-emitting material, may emit red light, green light, blue light, or white light; the light-emitting layer 1182 may further include functional layers such as an electron injection layer, an electron transport layer, a hole injection layer, and a hole transport layer, as necessary.

For example, the second electrode 1182 of the light-emitting element 118 may include various conductive materials. For example, the second electrode 1183 of the light-emitting element 118 may include a metal material such as lithium (Li), aluminum (Al), magnesium (Mg), or silver (Ag), or the like.

For example, a material of the pixel defining layer 130 may include an organic insulating material such as polyimide, poly-phthalein-imine, polyamide, acrylic resin, benzocyclobutene, or phenol resin. Alternatively, the material of the pixel defining layer 130 may include an inorganic insulating material such as silicon oxide or silicon nitride, which is not limited in the embodiments of the present disclosure.

Further, the first plate C11 of the storage capacitor C1 is disposed between the second insulating layer 124 and the third insulating layer 125; the second plate C12 is disposed between the first insulating layer 122 and the second insulating layer 124. The first plate C11 and the second plate C12 of the storage capacitor C1 at least partially overlap each other in the direction perpendicular to the base substrate 111. The second insulating layer 124 is used as a dielectric material between the first plate C11 and the second plate C12 of the storage capacitor C1 to form the storage capacitor C1 together with the first plate C11 and the second plate C12. The second plate C12 of the storage capacitor C1 is disposed in the same layer as the gate layer 123 in the pixel circuit 1121. Likewise, as described above, in the above variant example, the first plate C11 and the second plate C12 of the storage capacitor C1 may alternatively be located in other layers, resulting in a sub-pixel having a different structure.

In some embodiments, as shown in FIG. 4, the display substrate 110 may further include an encapsulation layer 131 disposed on the light-emitting element 118. The encapsulation layer 131 seals the light-emitting element 118, so that deterioration of the light-emitting element 118 caused by moisture and/or oxygen included in the environment can be reduced or avoided. The encapsulation layer 131 may have a single-layer structure or a composite-layer structure including a stack of inorganic layers and organic layers. For example, the encapsulation layer 131 may include a first inorganic encapsulation layer 1311, a first organic encapsulation layer 1312, and a second inorganic encapsulation layer 1313, which are sequentially disposed.

For example, a material of the encapsulation layer 131 may include an insulating material, such as silicon nitride, silicon oxide, silicon oxynitride, or polymer resin. The inorganic material, such as silicon nitride, silicon oxide, and silicon oxynitride, have high compactness, which can prevent invasion of water, oxygen, or the like; a material of the organic encapsulation layer 131 may be a polymer material containing a desiccant, or a polymer material capable of blocking moisture, or the like. For example, the material of the organic encapsulation layer 131 may include a polymer resin, so as to flatten the surface of the display substrate 110, and to relieve stress on the first and second inorganic encapsulation layers 1311, 1313. Alternatively, the material of the organic encapsulation layer 131 may include a water-absorbing material such as a desiccant, so as to absorb water, oxygen, or the like that have penetrated inside the device.

Figure 6:
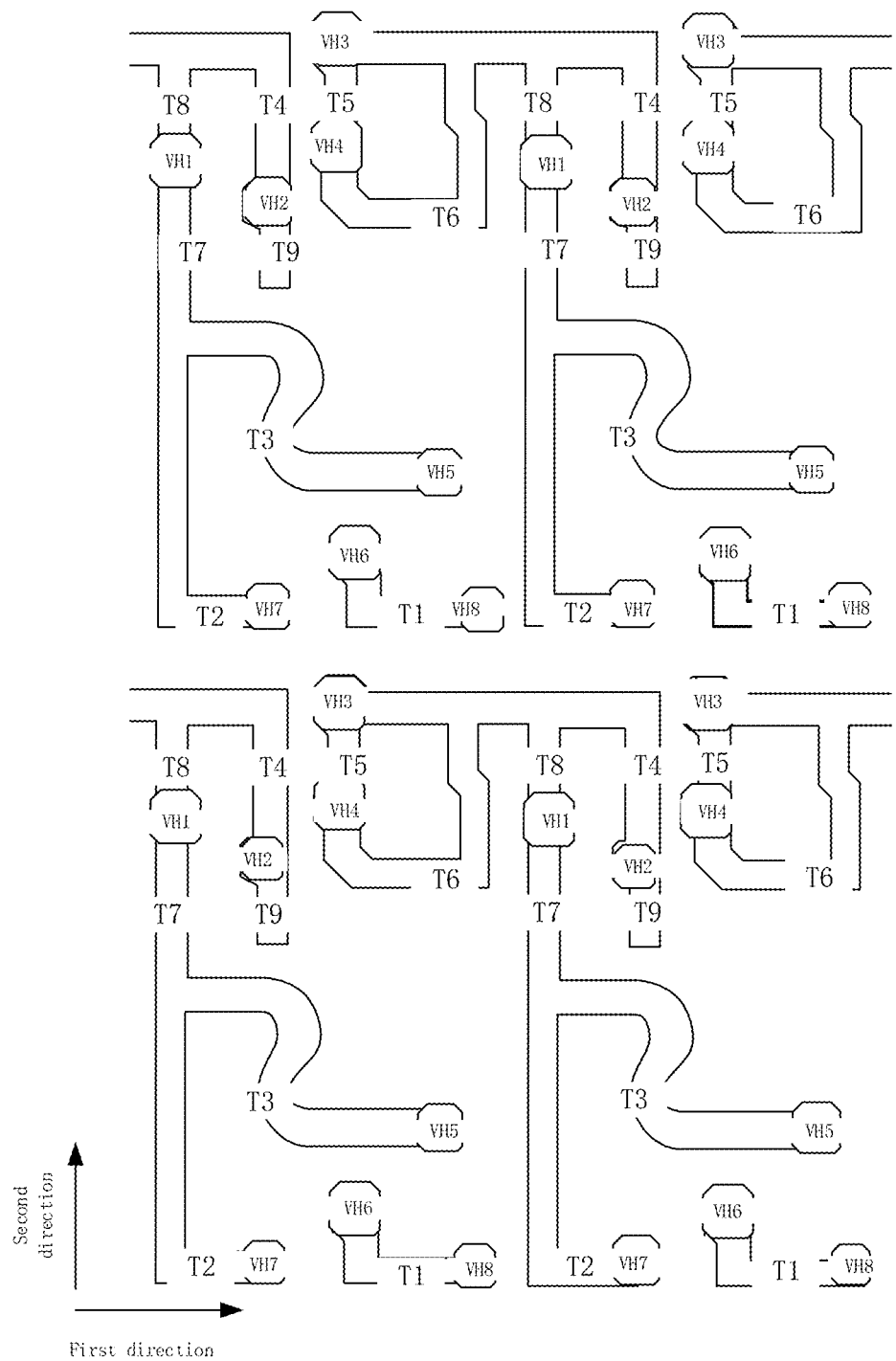
FIG. 6 is a schematic diagram of a semiconductor pattern layer of a display substrate according to an embodiment of the present disclosure.
Figure 7:
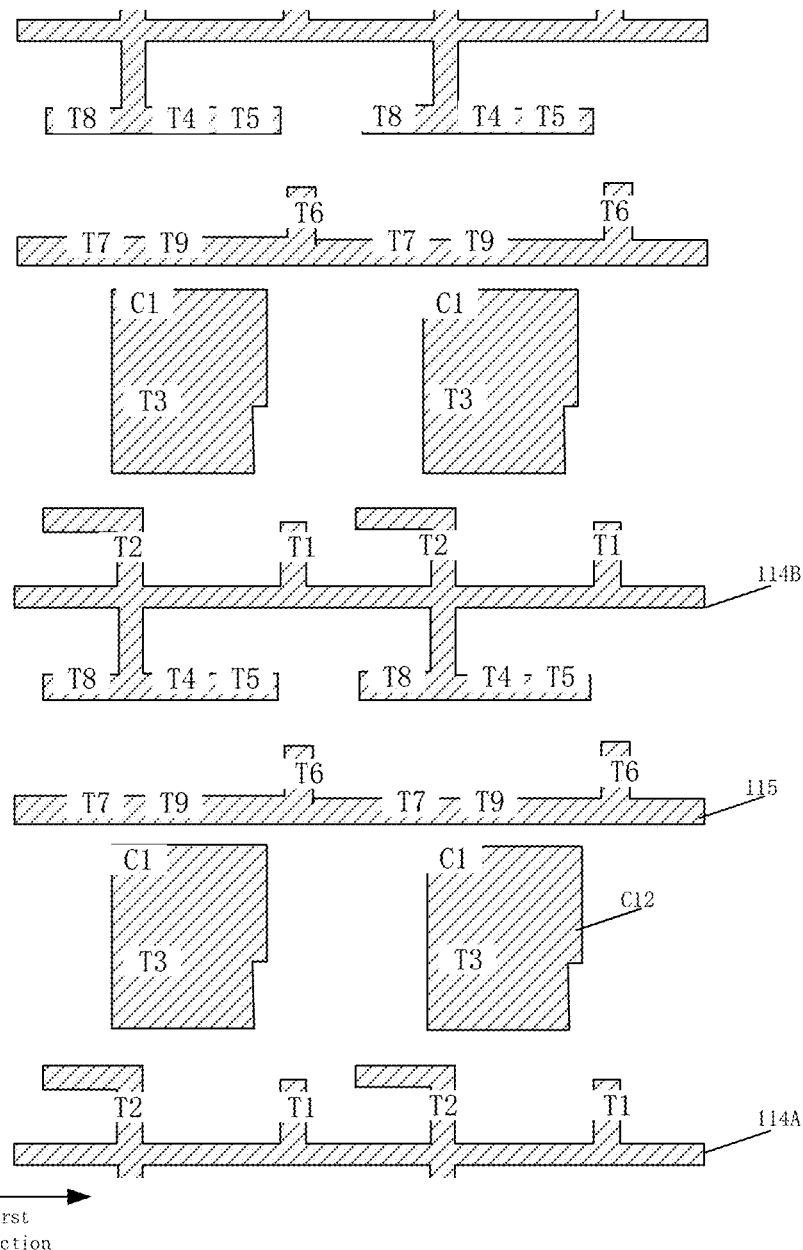
FIG. 7 is a schematic diagram of a first conductive pattern layer of a display substrate according to an embodiment of the present disclosure.
Figure 8:
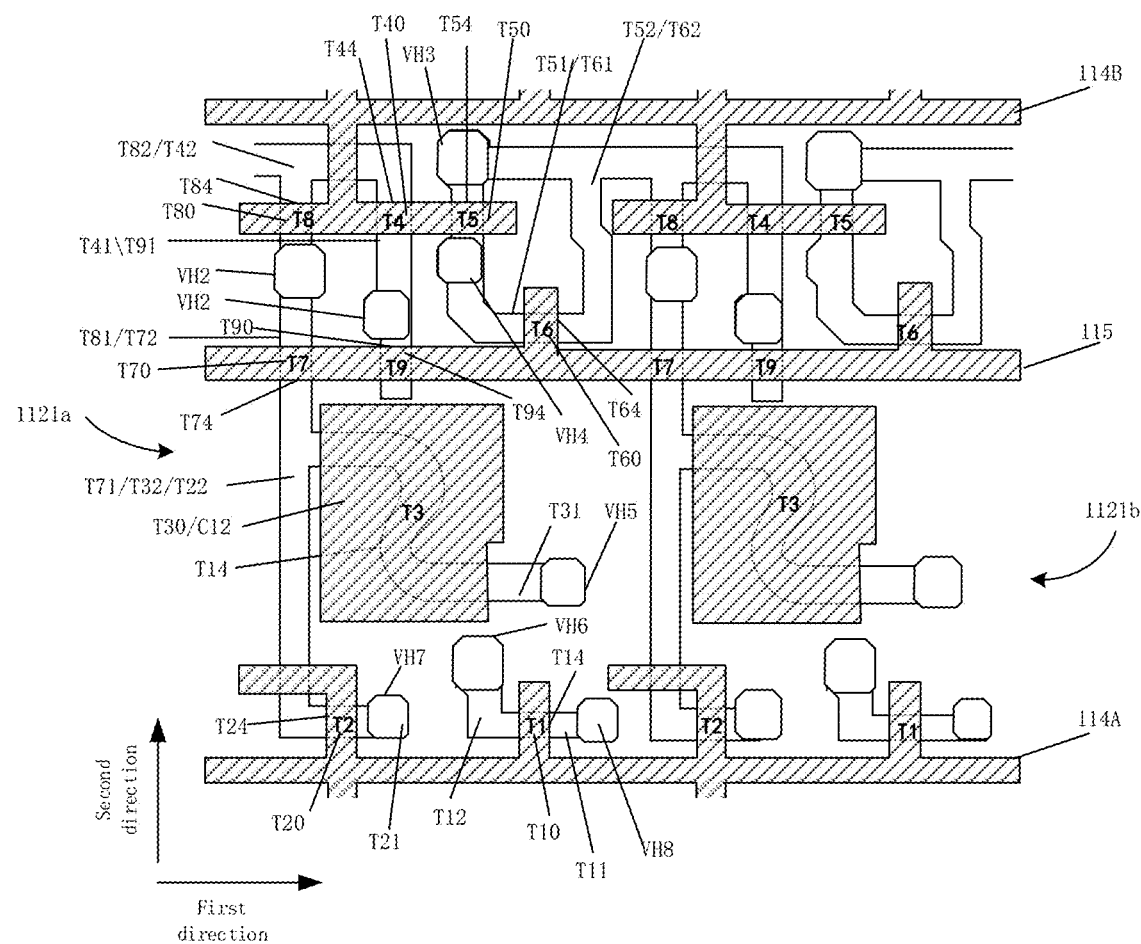
FIG. 8 is a schematic diagram of a structure of a display substrate after being subjected to a conductor treatment on a semiconductor pattern layer through a self-aligned process according to an embodiment of the present invention.

Referring to FIGS. 6 to 8, FIG. 6 is a schematic diagram illustrating a semiconductor pattern layer L1 of the display substrate 110. The first insulating layer 122 may be formed on the semiconductor pattern layer L1. FIG. 7 illustrates a schematic diagram of a first conductive pattern layer L2 formed on the first insulating layer 122 in the display substrate 110. FIG. 8 is a schematic diagram of a structure of the display substrate 110 after being subjected to a conductor treatment on the semiconductor pattern layer through a self-aligned process. In some embodiments, in the manufacturing process for the display substrate 110, a conductor treatment is performed on the semiconductor pattern layer L1 through a self-aligned process by using the first conductive pattern layer L2 as a mask. For example, the semiconductor pattern layer L1 is heavily doped through an ion implantation, so that the portion of the semiconductor pattern layer L1 not covered by the first conductive pattern layer L2 is conductive, thereby forming a source region (the first electrode T11) and a drain region (the second electrode T12) of the data writing transistor T1, a source region (the first electrode T21) and a drain region (the second electrode T22) of the first compensation transistor T2, a source region (the first electrode T31) and a drain region (the second electrode T32) of the driving transistor T3, a source region (the first electrode T41) and a drain region (the second electrode T42) of the first reset transistor T4, a source region (the first electrode T51) and a drain region (the second electrode T52) of the second reset transistor T5, a source region (the first electrode T61) and a drain region (the second electrode T62) of the third reset transistor T6, a source region (the first electrode T71) and a drain region (the second electrode T72) of the light-emitting control transistor T7, a source region (the first electrode T81) and a drain region (the second electrode T82) of the fourth reset transistor T8, and a source region (the first electrode T91) and a drain region (the second electrode T92) of the second compensation transistor T9. The portion of the semiconductor pattern layer L1 covered by the first conductive pattern layer L2 retains semiconductor characteristics, thereby forming a channel region T14 of the data writing transistor T1, a channel region T24 of the first compensation transistor T2, a channel region T34 of the drive transistor T3, a channel region T44 of the first reset transistor T4, a channel region T54 of the second reset transistor T5, a channel region T64 of the third reset transistor T6, a channel region T74 of the light-emitting control transistor T7, a channel region T84 of the fourth reset transistor T8, and a channel region T94 of the second compensation transistor T9.

As shown in FIG. 8, the second electrode T82 of the fourth reset transistor T8 and the second electrode T42 of the first reset transistor T4 are integrally formed. The first electrode T91 of the second compensation transistor T9 and the first electrode T41 of the first reset transistor T4 are integrally formed. The first electrode T81 of the fourth reset transistor T8 and the second electrode T72 of the light-emitting control transistor T7 are integrally formed. The first electrode T71 of the light-emitting control transistor T7, the second electrode T32 of the driving transistor T3, and the second electrode T22 of the first compensation transistor T2 are integrally formed. The first electrode T51 of the second reset transistor T5 and the first electrode T61 of the third reset transistor T6 are integrally formed. The second electrode T52 of the second reset transistor T5 and the second electrode T62 of the third reset transistor T6 are integrally formed. In particular, the second plate C12 of the storage capacitor C1 may serve as the gate electrode T30 of the driving transistor T3.

For example, a material of the channel region 1213 (the active layer 121) of each transistor in the embodiments of the present disclosure may be single crystal silicon, poly-silicon (e.g., low temperature poly-silicon), or a metal oxide semiconductor material (e.g., IGZO, AZO, etc.). In one embodiment, the transistors are both P-type Low Temperature Poly-silicon (LTPS) thin film transistors. In another embodiment, the first compensation transistor T2 and the first reset transistor T4 directly connected to the gate electrode T30 of the driving transistor T3 are metal oxide semiconductor thin film transistors, that is, the channel material of the transistors is an metal oxide semiconductor material (e.g., IGZO, AZO, etc.), and the metal oxide semiconductor thin film transistors have a lower leakage current, which can reduce a leakage current of the gate electrode T30 of the driving transistor T3.

For example, transistors in embodiments of the present disclosure may include a variety of structures, such as a top-gate type, a bottom-gate type, or a double-gate structure. In one embodiment, the first compensation transistor T2 and the first reset transistor T4 directly connected to the gate electrode T30 of the driving transistor T3 are dual-gate thin film transistors, which can reduce the leakage current of the gate electrode T30 of the driving transistor T3.

It should be noted that the semiconductor pattern layer L1 may be the active layer 121 discussed above, and the first conductive pattern layer L2 may be the gate layer 123 discussed above.

In some embodiments, FIG. 6 shows a correspondence between the semiconductor pattern layer L1 and vias VH1, VH2, VH3, VH4, VH5, VH6, VH7, and VH8 formed on the display substrate 110, and the semiconductor pattern layer L1 may be connected to other layers of the display substrate 110 through the vias.

Figure 9:
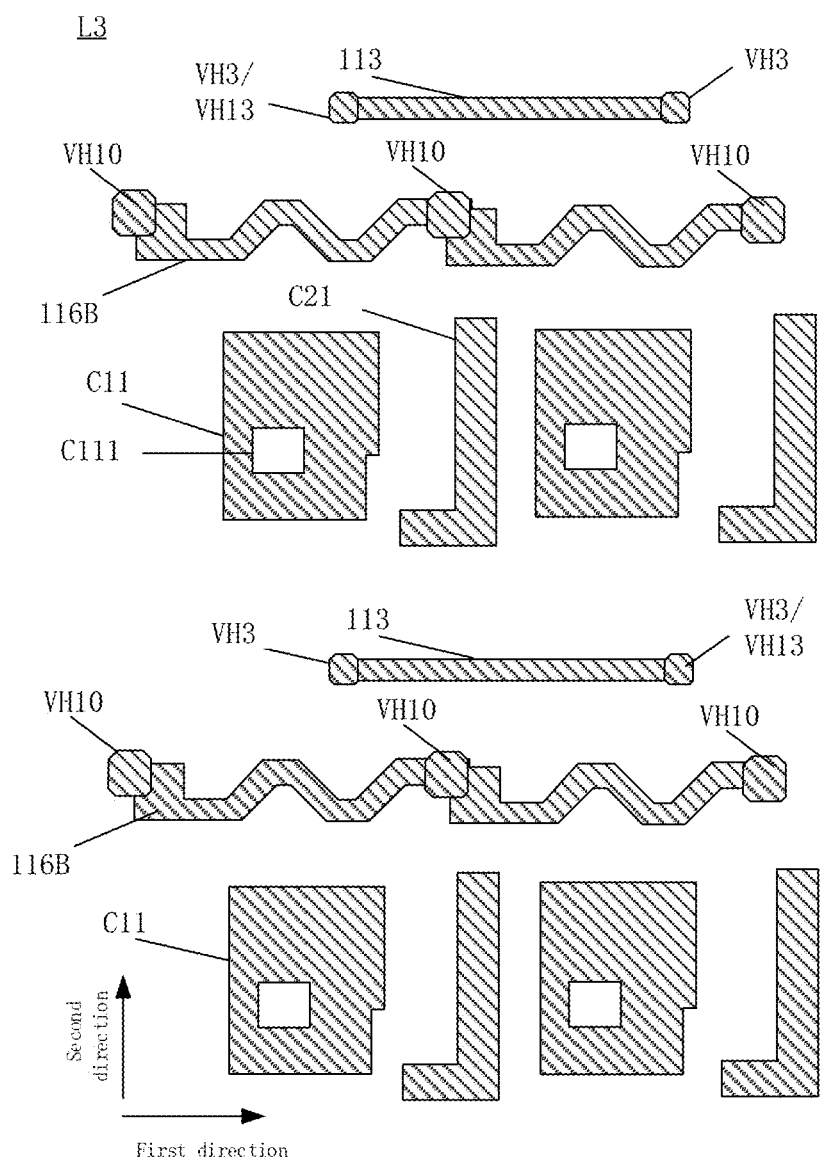
FIG. 9 is a schematic diagram of a second conductive pattern layer of a display substrate according to an embodiment of the present disclosure.

Referring to FIG. 9, in some embodiments, the second insulating layer 124 is formed on the structure on which the conductor treatment is performed, and a second conductive pattern layer L3 is formed on the second insulating layer 124. The second conductive pattern layer L3 includes the first plate C11 of the storage capacitor C1 and the initialization signal line 113. The first plate C11 of the storage capacitor C1 is provided in the same layer as the initialization signal line 113. The first plate C11 of the storage capacitor C1 has an electrode via C111 therein, to facilitate electrical connection between the first connection electrode 11211 and the second plate C12 (the gate electrode T30 of the driving transistor T3) of the storage capacitor C1 through the electrode via C111. The first connection electrode 11211 and the first plate C11 of the storage capacitor C1 are insulated from each other.

In some embodiments, the via VH3 may penetrate through the first and second insulating layers 122 and 124, so that the initialization signal line 113 may be connected to the second electrode T42 of the first reset transistor T4, the second electrode T52 of the second reset transistor T5, the second electrode T62 of the third reset transistor T6, and the second electrode T82 of the fourth reset transistor T8 through the via VH3.

It should be noted that the second conductive pattern layer L3 may be located between the second insulating layer 124 and the third insulating layer 125.

In some embodiments, the second conductive pattern layer L3 further includes the third power line 116B, i.e., the third power line 116B is disposed in the same layer as the first plate C11 of the storage capacitor C1 and the initialization signal line 113. Specifically, the third power line 116B is located between the first plate C11 of the storage capacitor C1 and the initialization signal line 113.

Figure 10:
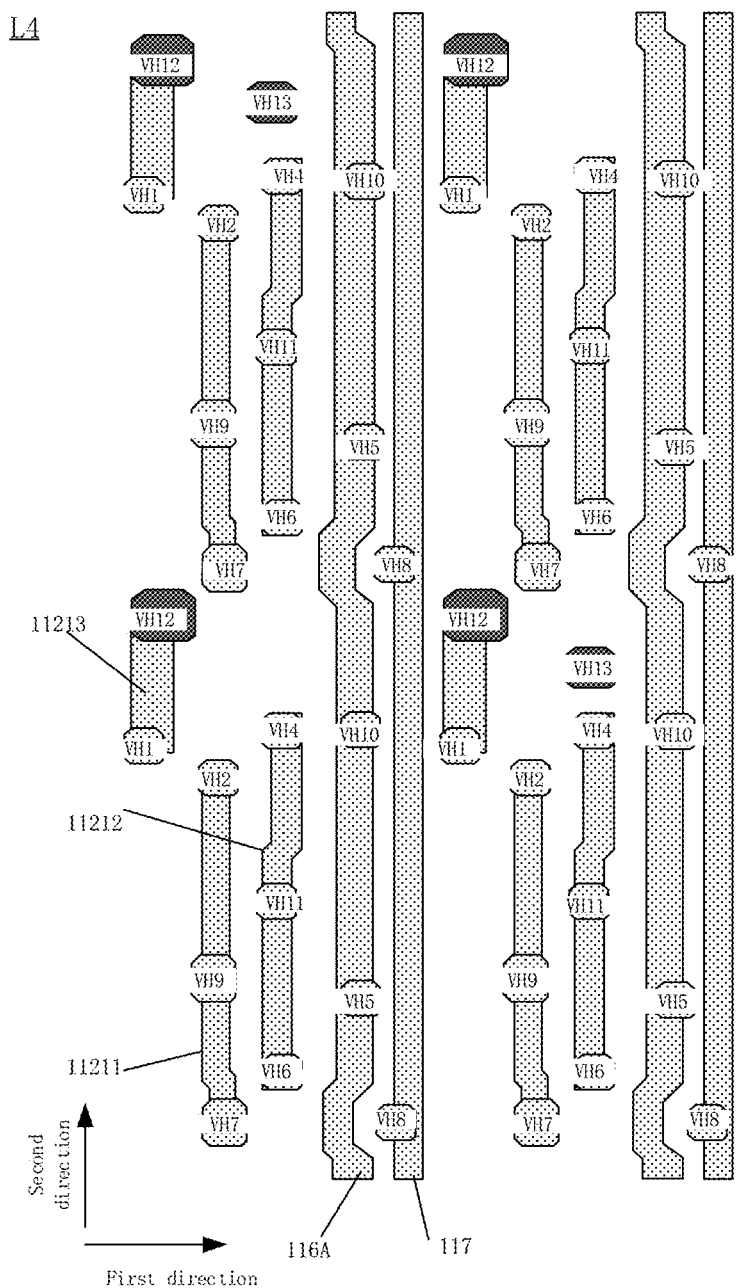
FIG. 10 is a schematic diagram of a third conductive pattern layer of a display substrate according to an embodiment of the present disclosure.

As shown in FIG. 10, in the display substrate 110, the third insulating layer 125 may further be formed on a side of the second conductive pattern layer L3 away from the first conductive pattern layer L2, and then a third conductive pattern layer L4 is formed on a side of the third insulating layer 125 away from the second conductive pattern layer L3; the third conductive pattern layer L4 is formed with the first connection electrode 11211, the second connection electrode 11212, the first adapter electrode 11213, the data lines 117, and the first power lines 116A therein. The first connection electrode 11211, the second connection electrode 11212, the adapter electrode 11213, the data lines 117, and the first power lines 116A are located in the same layer.

For example, the first conductive pattern layer L2, the second conductive pattern layer L3 and the third conductive pattern layer L4 are all made of metal materials. For example, the first conductive pattern layer L2 is formed of the same metal material through the same patterning process, the second conductive pattern layer L3 is formed of the same metal material through the same patterning process, and the third conductive pattern layer L4 is formed of the same metal material through the same patterning process. For example, the metal material includes molybdenum (Mo) metal, aluminum metal, and titanium metal, but is not limited thereto. For example, the first conductive pattern layer L2, the second conductive pattern layer L3 and the third conductive pattern layer L4 may be made of the molybdenum metal, but are not limited thereto.

It is to be understood that the third conductive pattern layer L4 may be the source-drain layer 126. The display substrate 110 further includes a via VH9, a via VH10, and a via VH11. The via VH1, the via VH2, the via VH4, the via VH5, the via VH6, the via VH7, and the via VH8 may penetrate through the first, second, and third insulating layers 122, 124, and 125, the via VH9 may penetrate through the second and third insulating layers 124 and 125, and the via VH10 and the via VH11 may penetrate through the third insulating layer 125.

As such, the adapter electrode 11213 may be connected to the first electrode T81 of the fourth reset transistor T8 and the second electrode T72 of the light-emitting control transistor T7 through the via VH1. The first connection electrode 11211 may be connected to the first electrode T91 of the second compensation transistor T9 and the first electrode T41 of the first reset transistor T4 through the via VH2, and connected to the second plate C12 of the storage capacitor C1 through the via VH9, and connected to the first electrode T21 of the first compensation transistor T2 through the via VH7, wherein the via VH9 corresponds to the electrode via C111. The second connection electrode 11212 may be connected to the first electrode T51 of the second reset transistor T5 and the second electrode T62 of the third reset transistor T6 through the via VH4, and to the first plate C11 of the storage capacitor C1 through the via VH11 and to the second electrode T12 of the data writing transistor T1 through the via VH6. The data line 117 may be connected to the first electrode T11 of the data writing transistor T1 through the via VH8. The first power line 116A may be connected to the third power line 116B through the via VH10.

In some embodiments, the second conductive layer L3 further includes a capacitor plate C21, the capacitor plate C21 is disposed corresponding to the data lines 117, and the capacitor plate C21 can shield interference between the data lines 117 and other signal lines.

Figure 11:
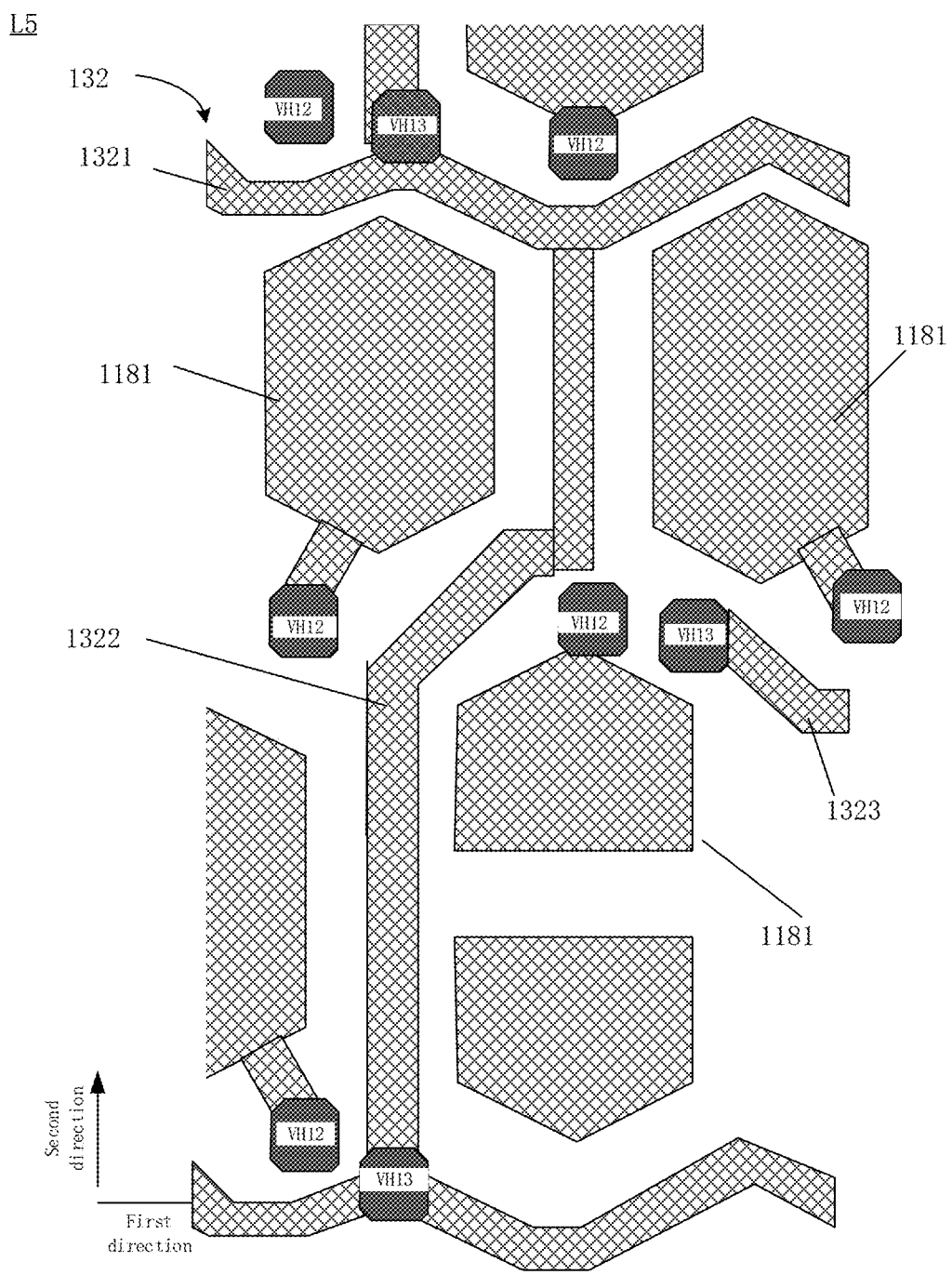
FIG. 11 is a schematic diagram of an anode circuit pattern layer of a display substrate according to an embodiment of the present disclosure.

Referring to FIG. 11, in some embodiments, the display substrate 110 includes an initialization bus 132 disposed on a side of the initialization signal line 113 away from the base substrate 111, and electrically connected to the initialization signal line 113. Specifically, the passivation layer 128 may be formed on a side of the third conductive pattern layer L4 away from the second conductive pattern layer L3 and the planarization layer 127 may be formed on a side of the passivation layer 128 away from the third conductive pattern layer L4, and then an anode circuit pattern layer L5 is formed on a side of the planarization layer 127 away from the third conductive pattern layer L4 and includes the first electrode 1181 of the light-emitting element 118 and the initialization bus 132. The initialization bus 132 and the first electrode 1181 of the light-emitting element 118 are disposed in the same layer. In one example, the light-emitting element 118 is an OLED, and the first electrode 1181 of the light-emitting element 118 is an anode of the OLED. The initialization bus 132 may be connected to the initialization signal line 113 of the second conductive pattern layer L3 through a via in the passivation layer 128 and the planarization layer 127.

In this way, the initialization bus 132 may further supply the initialization signal Vinit to the adjacent first and second pixel circuits 1121a and 1121b through the initialization signal line 113 having a plurality of segments by fully utilizing a wiring space in the anode circuit pattern layer.

In some embodiments, the display substrate 110 may further include a via VH12 and a via VH13. The via VH12 penetrates through the passivation layer 128 and the planarization layer 127, and the via VH13 penetrates through the passivation layer 128 and the planarization layer 127.

In this way, the adapter electrode 11213 may be connected to the first electrode 1181 of the light-emitting element 118 through the via VH12, and the initialization signal line 113 may be connected to the initialization bus 132 through the via VH13.

In some embodiments, the initialization bus 132 includes a plurality of main portions 1321, a plurality of connection portions 1322, and a plurality of branch portions 1323; the plurality of main portions 1321 extend in the first direction and are arranged at intervals in the second direction, and are configured to supply the initialization signal Vinit to a corresponding plurality of initialization signal lines 113 each of which extends in the first direction and has the plurality of segments arranged at intervals; the plurality of connection portions 1322 extend in the second direction, so that two adjacent main portions 1321 are connected to each other through a corresponding connection portion 1322; one of the plurality of branch portions 1323 is connected to at least one of two adjacent main portions 1321; the plurality of connection portions 1322 and the plurality of branch portions 1323 are alternately arranged at intervals in the first direction, and the plurality of branch portions 1323 are configured to supply the initialization signal Vinit to a corresponding plurality of initialization signal lines 113, each of which is positioned between two adjacent main portions 1321, extends in the first direction, and has the plurality of segments arranged at intervals.

Figure 12:
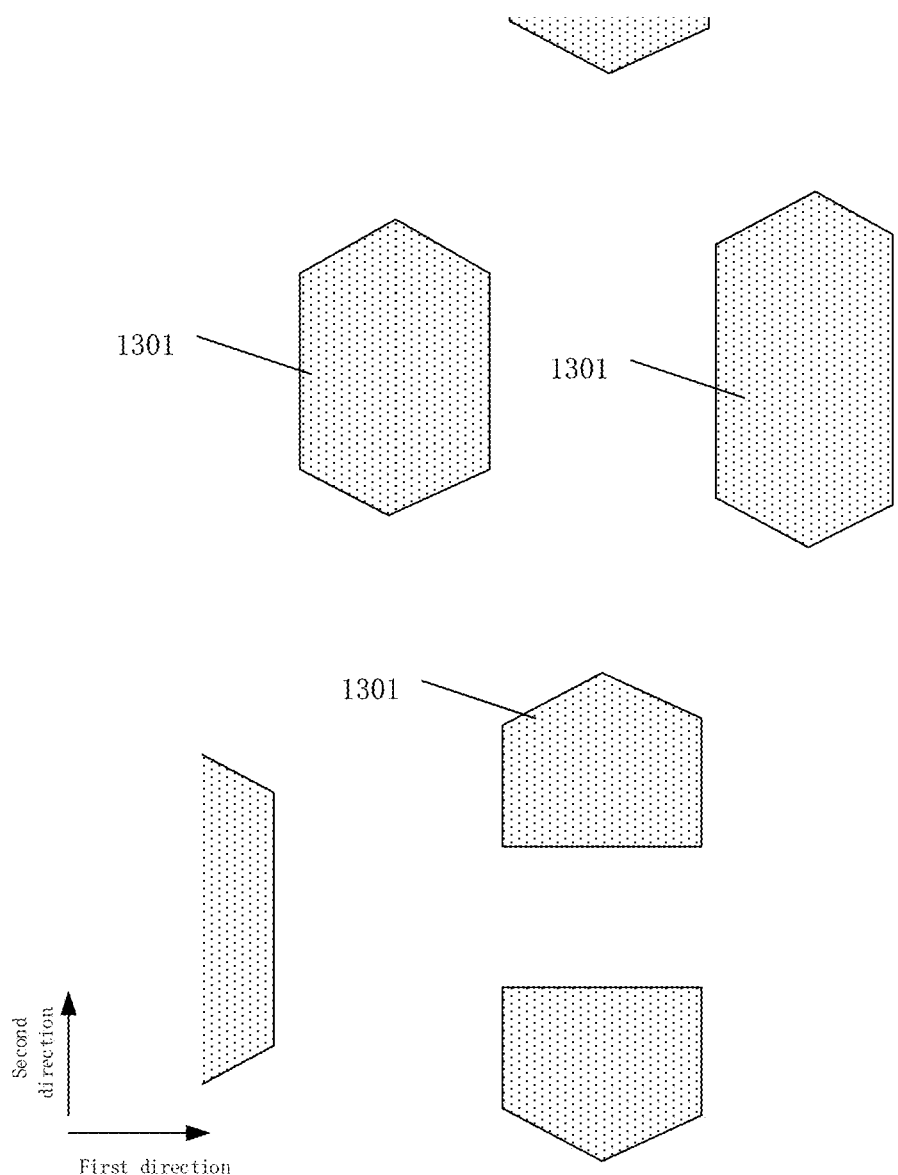
FIG. 12 is a schematic diagram of a cathode circuit pattern layer of a display substrate according to an embodiment of the present disclosure.

Referring to FIG. 12, in some embodiments, in the display substrate 110, a pixel opening layer L6 may be formed on a side of the anode circuit pattern layer L5 away from the substrate, and be provided with pixel openings 1301 corresponding to the anode circuit pattern layer L5.

It should be noted that the pixel opening layer L6 may be the pixel defining layer 130.

In the description of this specification, the description with reference to the term "one embodiment", "some embodiments", "illustrative embodiment", "an example", "a specific example" or "some examples" or the like means that a specific feature, structure, material, or characteristic described in connection with the embodiment or example is included in at least one embodiment or example of the present disclosure. In this specification, schematic representations of the above terms do not necessarily refer to the same embodiment or example. Furthermore, the specific feature, structure, material, or characteristic described may be combined in a suitable manner in any one or more embodiments or examples.

While the embodiment of the present disclosure has been shown and described, it will be understood by one of ordinary skill in the art that numerous changes, modifications, substitutions and variations may be made to the embodiment without departing from the principle and spirit of the present disclosure, the scope of the present disclosure is defined by the claims and their equivalents.

What is claimed is:

1. A display substrate, comprising:
a base substrate comprising a display region;
a plurality of pixel units in the display region, wherein each pixel unit comprises at least one pixel circuit comprising a first pixel circuit and a second pixel circuit adjacent to each other in a first direction;
an initialization signal line extending in the first direction and configured to supply an initialization signal to the first pixel circuit and the second pixel circuit;
a first control signal line extending in the first direction and configured to supply a gate signal to the first pixel circuit and the second pixel circuit; and
a light-emitting control signal line extending in the first direction and configured to supply a light-emitting control signal to the first pixel circuit and the second pixel circuit;
wherein the initialization signal line is on a side of the light-emitting control signal line away from the first control signal line, extends along the first direction and comprises a plurality of segments arranged at intervals;
the display substrate further comprises an initialization bus on a side of the initialization signal line away from the base substrate, wherein the initialization bus is electrically connected to the initialization signal line; and
wherein the initialization bus comprises a plurality of main portions, a plurality of connection portions, and a plurality of branch portions;
the plurality of main portions extend along the first direction and are arranged at intervals along a second direction, and are configured to provide the initialization signal to a corresponding plurality of initialization signal lines, each of which extends along the first direction and comprises a plurality of segments arranged at intervals;
the plurality of connection portions extend along the second direction, so that two adjacent main portions are connected to each other through a corresponding connection portion;
the plurality of branch portions each are connected to at least one of two adjacent main portions, the plurality of connection portions and the plurality of branch portions are alternately arranged at intervals along the first direction, and the plurality of branch portions are configured to respectively provide the initialization signal to a corresponding plurality of initialization signal lines, each of which is between the two adjacent main portions, extends along the first direction and comprises a plurality of segments arranged at intervals.

2. The display substrate according to claim 1, further comprising a second control signal line on a side of the initialization signal line away from the light-emitting control signal line,
wherein the second control signal line extends in the first direction and is configured to supply a reset control signal to the first pixel circuit and the second pixel circuit.

3. The display substrate according to claim 2, comprising a plurality of first power lines extending along the second direction and arranged at intervals along the first direction,
wherein the plurality of first power lines each are configured to provide a first power signal to a corresponding pixel circuit.

4. The display substrate according to claim 3, wherein the pixel circuit comprises a light-emitting control transistor;
a gate electrode of the light-emitting control transistor is connected to the light-emitting control signal line,
the light-emitting control transistor comprises a first electrode and a second electrode, and
the second electrode and the first electrode of the light-emitting control transistor are on a first side and a second side of the light-emitting control signal line opposite to each other, respectively.

5. The display substrate according to claim 4, wherein the pixel circuit comprises a driving transistor on the second side of the light-emitting control signal line;
the driving transistor comprises a first electrode and a second electrode,
the first electrode of the driving transistor is connected to a corresponding first power line; and
the second electrode of the driving transistor is connected to the first electrode of the light-emitting control transistor.

6. The display substrate according to claim 5, wherein the pixel circuit comprises a first reset transistor between the second control signal line and the light-emitting control signal line;
the second control signal line is connected to a gate electrode of the first reset transistor,
the first reset transistor comprises a first electrode and a second electrode,
the first electrode of the first reset transistor is connected to the gate electrode of the driving transistor, and
the second electrode of the first reset transistor is connected to a corresponding initialization signal line.

7. The display substrate according to claim 6, comprising a plurality of data lines extending along the second direction and spaced apart along the first direction, and configured to provide data signals to the pixel circuit.

8. The display substrate according to claim 7, wherein the pixel circuit comprises a storage capacitor, a data writing transistor, and a first compensation transistor;
the first control signal line is connected to a gate electrode of the data writing transistor and a gate electrode of the first compensation transistor;
the data writing transistor comprises a first electrode and a second electrode,
the first electrode of the data writing transistor is connected to a corresponding data line;
the storage capacitor comprises a first plate and a second plate,
the first plate of the storage capacitor is connected to a second electrode of the data writing transistor,
the second plate of the storage capacitor is connected to the gate electrode of the driving transistor;
the first compensation transistor comprises a first electrode and a second electrode,
the first electrode of the first compensation transistor is connected to the gate electrode of the driving transistor, and the second electrode of the first compensation transistor is connected to the second electrode of the driving transistor.

9. The display substrate according to claim 8, wherein the initialization signal line and the first electrode of the storage capacitor are in a same layer and spaced apart from each other.

10. The display substrate according to claim 9, wherein the data writing transistor and the first compensation transistor are on a side of the first control signal line close to the light-emitting control signal line.

11. The display substrate according to claim 10, wherein the pixel circuit comprises a second compensation transistor,
the light-emitting control signal line is connected to a gate electrode of the second compensation transistor,
the second compensation transistor comprises a first electrode on the first side of the light-emitting control signal line, and
the first electrode of the second compensation transistor is connected to the first electrode of the first reset transistor.

12. The display substrate according to claim 11, comprising a first connection electrode extending along the second direction,
wherein the first connection electrode is connected to the gate electrode of the driving transistor, the first electrode of the first compensation transistor, and the first electrode of the second compensation transistor.

13. The display substrate according to claim 12, wherein the pixel circuit comprises a second reset transistor and a third reset transistor between the second control signal line and the light-emitting control signal line;
the second control signal line is connected to a gate electrode of the second reset transistor,
the light-emitting control signal line is connected to a gate electrode of the third reset transistor;
the second reset transistor comprises a first electrode and a second electrode,
the first electrode of the second reset transistor is connected to the second electrode of the data writing transistor,
the second electrode of the second reset transistor is connected to a corresponding initialization signal line;
the third reset transistor comprises a first electrode and a second electrode,
the first electrode of the third reset transistor is connected to the second electrode of the data writing transistor, and
the second electrode of the third reset transistor is connected to a corresponding initialization signal line.

14. The display substrate according to claim 13, comprising a second connection electrode extending in the second direction,
wherein the second connection electrode is connected to the first electrode of the third reset transistor and the second electrode of the data writing transistor.

15. The display substrate according to claim 14, wherein the first connection electrode, the second connection electrode, the plurality of data lines, and the plurality of first power lines are in a same layer.

16. The display substrate according to claim 15, further comprising a light-emitting element,
wherein the second electrode of the light-emitting control transistor is connected to a first electrode of the light-emitting element, and
the initialization bus and the first electrode of the light-emitting element are in a same layer and spaced apart from each other.

17. The display substrate according to claim 16, wherein the pixel circuit comprises a fourth reset transistor between the second control signal line and the light-emitting control signal line;
the second control signal line is connected to a gate electrode of the fourth reset transistor,
the fourth reset transistor comprises a first electrode and a second electrode,
the first electrode of the fourth reset transistor is connected to the first electrode of the light-emitting element, and
the second electrode of the fourth reset transistor is connected to a corresponding initialization signal line.

18. A display apparatus, comprising the display substrate according to claim 1.

* * * * *